(12) United States Patent
Mobley

(10) Patent No.: US 7,650,694 B2
(45) Date of Patent: Jan. 26, 2010

(54) METHOD FOR FORMING MULTILAYER SUBSTRATE

(75) Inventor: Washington M. Mobley, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/173,461

(22) Filed: Jun. 30, 2005

(65) Prior Publication Data
US 2007/0000688 A1    Jan. 4, 2007

(51) Int. Cl.
*H05K 3/46*    (2006.01)
(52) U.S. Cl. .............................. 29/846; 29/830; 29/851; 29/852; 174/258; 174/262; 174/264; 205/125; 205/162
(58) Field of Classification Search .................... 29/831, 29/830, 852, 846, 847, 851; 174/258, 262–266; 205/125, 126, 162; 361/792–795; 428/475.8
See application file for complete search history.

(56) References Cited

U.S. PATENT DOCUMENTS

| | | | |
|---|---|---|---|
| 4,616,292 A * | 10/1986 | Sengoku et al. | 361/794 |
| 4,751,146 A * | 6/1988 | Maeda et al. | 428/475.8 |
| 5,196,251 A * | 3/1993 | Bakhru et al. | 428/76 |
| 5,346,750 A | 9/1994 | Hatakeyama et al. | 428/209 |
| 5,481,795 A | 1/1996 | Hatakeyama et al. | 29/852 |
| 5,500,278 A * | 3/1996 | Nagasaka | 428/210 |
| 5,627,344 A * | 5/1997 | Tanifuji et al. | 174/257 |
| 5,768,109 A * | 6/1998 | Gulick et al. | 361/794 |
| 6,195,882 B1 | 3/2001 | Tsukamoto et al. | 29/852 |
| 6,219,253 B1 * | 4/2001 | Green | 361/761 |
| 6,506,681 B2 | 1/2003 | Grigg et al. | 438/692 |
| 6,703,565 B1 | 3/2004 | Tsukamoto et al. | 174/259 |
| 6,753,483 B2 | 6/2004 | Andoh et al. | 174/262 |
| 6,756,628 B2 | 6/2004 | Echigo et al. | 257/306 |
| 6,762,369 B2 | 7/2004 | Saito et al. | 174/262 |
| 6,916,706 B2 | 7/2005 | Echigo et al. | 438/253 |
| 7,002,080 B2 | 2/2006 | Tani et al. | 174/258 |

(Continued)

FOREIGN PATENT DOCUMENTS

WO    WO 2004077548 A2 *    9/2004

(Continued)

OTHER PUBLICATIONS

Liu, Processing and Reliability Assessment of Solder Joint Interconnection for Power Chips, Feb. 27, 2001, cover sheet and pp. 248-250, internet: http://scholar.lib.vt.edu/theses/available/etd-04082001-204805/unrestricted/.*

(Continued)

*Primary Examiner*—A. Dexter Tugbang
*Assistant Examiner*—Livius R Cazan
(74) *Attorney, Agent, or Firm*—Konrad Raynes & Victor LLP; Allan S. Raynes

(57) ABSTRACT

Embodiments include electronic device substrates and methods for forming the same. A method for forming a package comprising a multilayer substrate includes forming a stack of a plurality of dielectric layers comprising a ceramic material, the stack including upper and lower dielectric layers. The method also includes providing a plurality of metallization lines on the dielectric layers in the stack. The method also includes forming a plurality of vias in the dielectric layers, the vias formed to include electrically conductive material therein. A first metal layer is formed on the upper dielectric layer, and a second metal layer is formed on the lower dielectric layer. The first metal layer and the second metal layer are each formed to be at least 250 μm thick. Other embodiments are described and claimed.

14 Claims, 4 Drawing Sheets

U.S. PATENT DOCUMENTS

| | | | |
|---|---|---|---|
| 7,018,705 B2 | 3/2006 | Nakatani et al. | 428/209 |
| 7,059,039 B2 | 6/2006 | Tsukamoto et al. | 29/830 |
| 7,208,347 B2 * | 4/2007 | Seliger et al. | 438/124 |
| 2003/0094307 A1 | 5/2003 | Saito et al. | 174/262 |
| 2004/0040738 A1 | 3/2004 | Tani et al. | 174/250 |
| 2004/0231151 A1 | 11/2004 | Nakatani et al. | 29/830 |
| 2005/0100720 A1 | 5/2005 | Shirai et al. | 428/209 |
| 2006/0137905 A1 | 6/2006 | Kariya et al. | 174/255 |

FOREIGN PATENT DOCUMENTS

WO  WO2005055684  6/2005

OTHER PUBLICATIONS

Printout of http://scholar.lib.vt.edu/theses/available/etd-04082001-204805/unrestricted/.*

"Interconnect Substrates—Ceramic", 2002 IMAPS-CII/NEMI Technology Roadmaps, Dec. 2002, pp. i-49, (at least pp. 11-13 may be relevant).

* cited by examiner

METHOD FOR FORMING MULTILAYER SUBSTRATE

RELATED ART

As power delivery requirements for high performance package substrates increase, current methods for forming packages such as ceramic paste print buildup may be insufficient due to a number of factors. For example, to form adequately thick metallization using ceramic paste metallization, numerous layers may be needed, which means that numerous processing steps such as printing and firing must be carried out. In addition, the typical conducting layers formed from ceramic paste printing may not be able to deliver adequate power due to the lower electrical conductivity of ceramic paste metallization, which, for example, has a conductivity that is about 2 to 5 times less than that of pure copper.

Thin organic substrates (for example, less than 0.5 mm) have been formed with small, blind and buried vias. Such thin organic substrates are not particularly rigid or flat and thus not applicable for certain types of high performance applications that require substantial co-planarity to achieve interconnection (for example, very fine pitch ultra-large die and form factor packages). Other organic substrates have been formed with plated through-holes (PTHs). As the thickness of conventional organic package substrates is increased, the aspect ratio of the PTHs increases and makes it harder to properly plate a small diameter through-hole, which can cause electrical problems. Larger plated through-holes could be formed, but such large PTHs cause problems with power delivery performance. As a result, thick package substrates are typically formed using a ceramic process flow such as a ceramic paste metallization.

BRIEF DESCRIPTION OF THE DRAWINGS

Embodiments are described by way of example, with reference to the accompanying drawings, which are not drawn to scale, wherein.

DETAILED DESCRIPTION

High-performance integrated circuit packaging substrates may in certain applications need to utilize the properties of materials such as ceramics (which, for example, provide for high rigidity and reduced warpage) while at the same time requiring ample amounts of conductive material to meet increasing power delivery needs. Certain embodiments relate to devices and methods for providing packages that can meet such needs.

Figure 1:
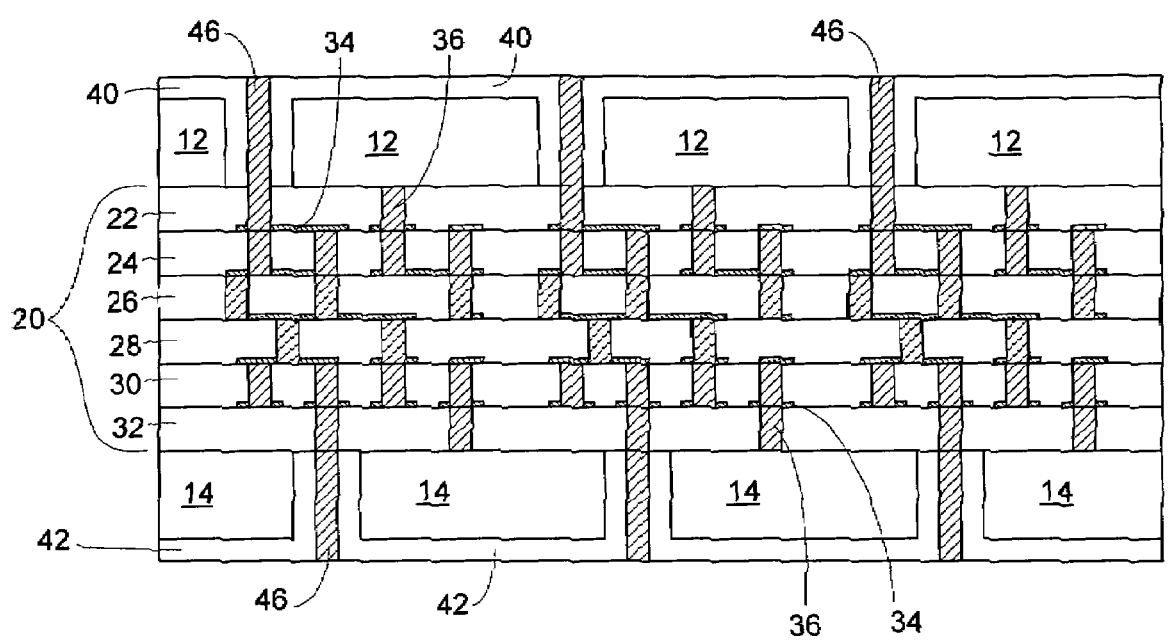
FIG. 1 illustrates a substrate having a stack of ceramic layers, metallization traces, and vias, and also including thick metal layers formed at the ends of the ceramic stack, in accordance with certain embodiments.

FIG. 1 illustrates a substrate 10 including a central region having a plurality of ceramic layers 22, 24, 26, 28, 30, and 32 with metallization traces 34 therebetween, and vias 36 extending between various of the layers. The vias 36 include buried and blind vias, depending on their location in the region 20. The vias 36 have electrically conducting material therein, and transmit signals to various locations in the stack. Other devices such as capacitors and the like (not shown) may also be formed within the stack, if desired. Such a structure, with the plurality of ceramic layers, metallization traces 34, and vias 36, may be formed using a variety of suitable methods, including, but not limited to, a ceramic paste print process such as LTCC (low temperature ceramic co-fire) or HTCC (high temperature ceramic co-fire).

In a conventional LTCC method, a ceramic tape formed from, for example, a glass-ceramic composition, is provided in a roll with a thermal expansion matched metallization paste that can be printed onto the surface of the tape. The ceramic tape is cut into individual sheets, which are then punched to form the vias, and the metallized paste is printed or otherwise formed on the desired locations on the tape sheet. The sheet is dried, and then a plurality of sheets are stacked, laminated and co-fired at an elevated temperature to form a high density multilayer integrated substrate such as the central region 20 of the substrate 10.

As power needs increase, the metallization paste can be applied in thicker amounts as needed, in order to conduct more electricity into the package. However, in conventional processes, the metallization paste is formed into a relatively thin layer, and as a result, many layers must be built up if a substantial amount of metal is desired. Adding multiple layers increases the time and expense of the processing. In addition, the metallization compositions typically used for paste print packages have a substantially lower conductivity than, for example, pure copper. This makes it difficult, time consuming, and expensive to form a high power substrate using conventional structures and techniques.

As seen in FIG. 1, the package 10 also includes layers 12 and 14 positioned at the upper and lower ends of the ceramic layers 22, 24, 26, 28, 30, and 32, with layer 12 positioned adjacent to ceramic layer 22 and layer 14 adjacent to ceramic layer 32. The layers 12 and 14 are formed from a metal that is plated on the ceramic layers. A variety of suitable plating processes for plating metals onto ceramics (for example, copper electroplating) may be used. By performing a plating process, a thicker metal layer can more readily be formed that when using a paste print process. For instance, in certain embodiments, the thickness of the plated layers 12 and 14 may be in the range of about 250 to about 400 μm, whereas the thickness of a layer of paste print metal is typically no greater than 10-20 μm. Thus, by forming end layers 12 and 14 using a plating process, a thicker layer having a higher conductivity can be formed. The conductivity of typical paste print metallization is about 2 to 5 times less than that of plated copper. In certain embodiments, the plating of the metal layers 12 and 14 after firing the central paste print region 20 reduces the number of metallized layers needed to meet power delivery requirements.

Figure 2:
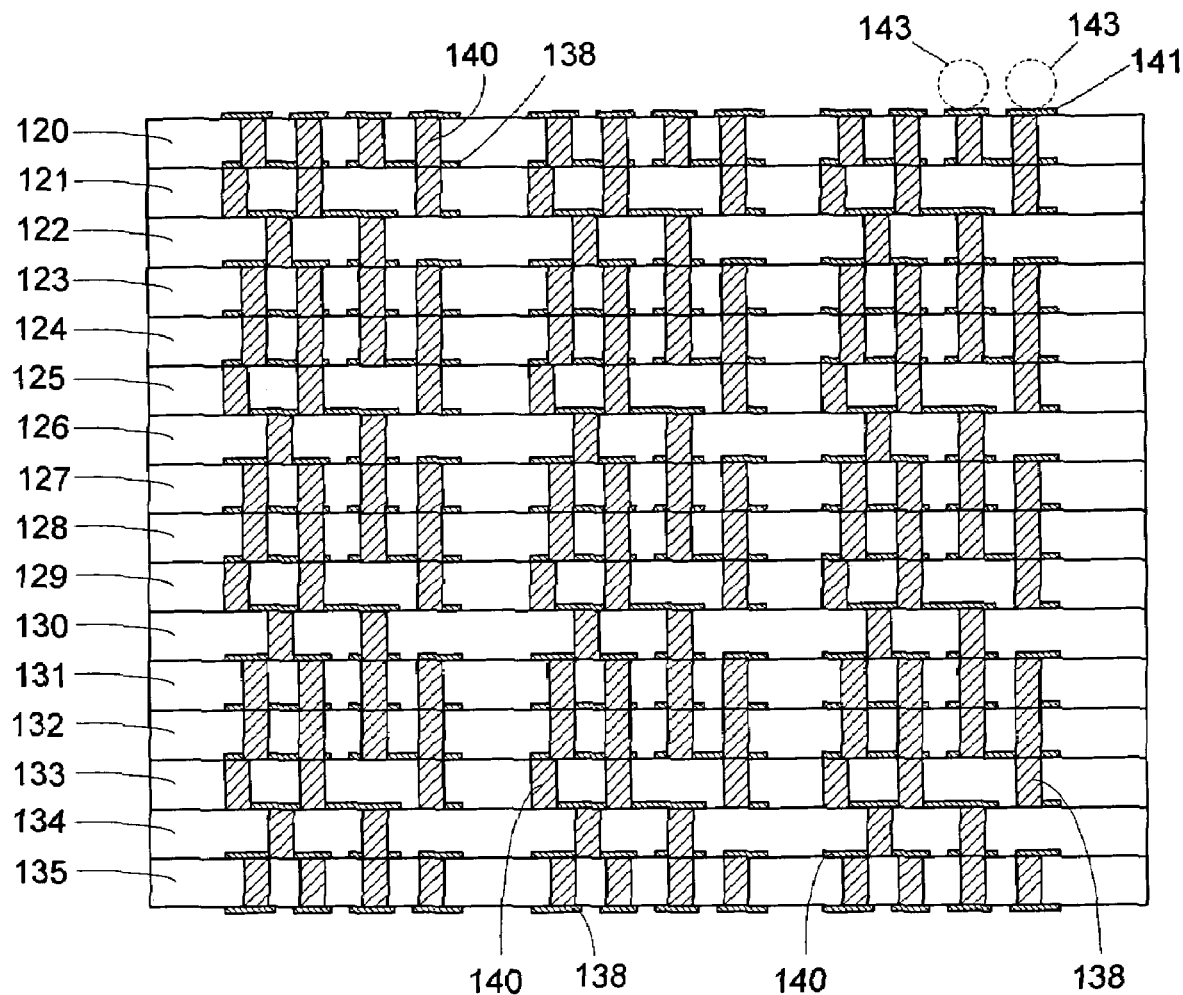
FIG. 2 illustrates a substrate including a thick stack of organic dielectric layers with metallization traces and vias, in accordance with certain embodiments.

The package 10 of FIG. 1 may further include electrically insulating layers 32 and 34 formed on the plated metal layers 12 and 14. Vias 46 having conducting material therein extend through the layers 32 and 34 to provide an electrical connection to the interior layers. To prevent electrical shorts the vias 46 shown in FIG. 2 are electrically isolated from the plated layers 12 and 14.

Certain embodiments may include packages including the layers illustrated in FIG. 1 and having an overall thickness of up to about 4 mm thick. The number of ceramic layers, paste print metallization traces, and even the number and thickness of the plated layers may be varied to obtain the desired electrical and mechanical properties for the particular application. Stacks of up to 50 or more ceramic layers are possible in certain embodiments, and multiple layers of plated material (for example, four total layers, with two layers on the top and bottom of the ceramic stack) are also possible. The plated layers may in certain embodiments be at least two times thicker than the individual ceramic layers, and in other embodiments may be at least four times thicker than the individual ceramic layers. In various embodiments, the overall thickness of the plated metal may be less than, equal to, or greater than the overall thickness of the ceramic layer and metallization stack. While copper is an example of a suitable plated material that may be used for the plated layers 12 and 14 of FIG. 1, other metal layers may also be used.

Certain embodiments may also form a similar structure to that shown in FIG. 1, while using a suitable direct bonding method to directly bond a thick layer of material such as copper to form the layers 12 and 14 of the package 10. In one example of a conventional direct bonding process for forming metal such as copper on a ceramic, a eutectic liquid formed from the copper metal and its surface oxide is used to form a bond to the ceramic. When the assembly is heated above the eutectic melting point but below the melting point of the pure copper, a thin layer of liquid is formed at the ceramic metal interface, which wets both surfaces and promotes adhesion of the copper to the ceramic. Such a method may be applied to certain embodiments to form copper layers of a variety of thicknesses, including, for example, layers in the thickness range of about 250 μm and greater, with certain embodiments having a metal layer thickness in the range of 250 μm to 400 μm.

In other aspects related to certain embodiments, high-performance integrated circuit packaging substrates may in certain applications need to be thick, in order to reduce warpage, co-planarity, and rigidity problems with thinner package substrates. Such thick packaging substrates have typically been formed with ceramic layers and using a ceramic process flow such as those used for ceramic paste printing as described earlier. Certain embodiments described herein relate to devices and methods including the use of an organic process flow for forming thick packaging substrates.

FIG. 2 illustrates an organic package substrate 110 including a plurality of organic dielectric layers 120-135, with metallization traces 138, and blind and buried vias 140 extending through and between various of the layers. The vias 140 have electrically conducting material therein, and transmit signals to various locations in the stack. Other devices such as capacitors and the like (not shown) may also be formed within the stack if desired. Such a structure, with the plurality of dielectric layers 120-135, metallization traces 138, and vias 140, may be formed using an organic process flow to form a thick package substrate. For example, in certain embodiments, the substrate may be 1 to 4 mm in thickness, with certain preferred embodiments being 2 to 3 mm in thickness.

As illustrated in FIG. 2, the organic substrate has a structure that allows for mechanical rigidity, reduced warpage, and increased co-planarity, which is generally needed for certain applications such as, for example, flip chip packages requiring a large form factor so that a large die, for example, a die area of at least 20 mm$^2$, can be mounted thereon, using a bump pitch of less than 225 μm. Such a package substrate may in certain embodiments have a surface area of at least 50 mm$^2$. While FIG. 2 illustrates 16 dielectric layers, more or less could be used depending on the desired substrate specifications. Certain embodiments may include about 15-50 dielectric layers. The embodiment illustrated in FIG. 2 does not include a plated through-hole (PTH) for signal and power routing as formed as in most conventional organic dielectric layer substrates. However, the interconnect vias 126 formed in the individual layers 122, 124, 126, 128, 130, and 132, may extend through multiple layers, and may even extend through all of the organic dielectric layers in certain embodiments. The interconnect vias 126 can be formed and positioned to have a structure that provides suitable power delivery and electrical performance.

FIG. 2 also shows bonding pads 141 and examples of the position of solder bumps 143 positioned thereon. The solder bumps 143 may be positioned on a plurality of the bonding pads and are coupled to a flip chip die in addition to being coupled to the bonding pads 141. The bump pitch (spacing between bumps) may in certain embodiments be less than 225 μm.

Conventional thick package substrates utilize a multilayer ceramic structure and ceramic process flow. By using an organic dielectric structure and organic process flow, a thick substrate having desirable mechanical and electrical properties can be formed, using less process steps that a typical ceramic process flow.

Figure 3:
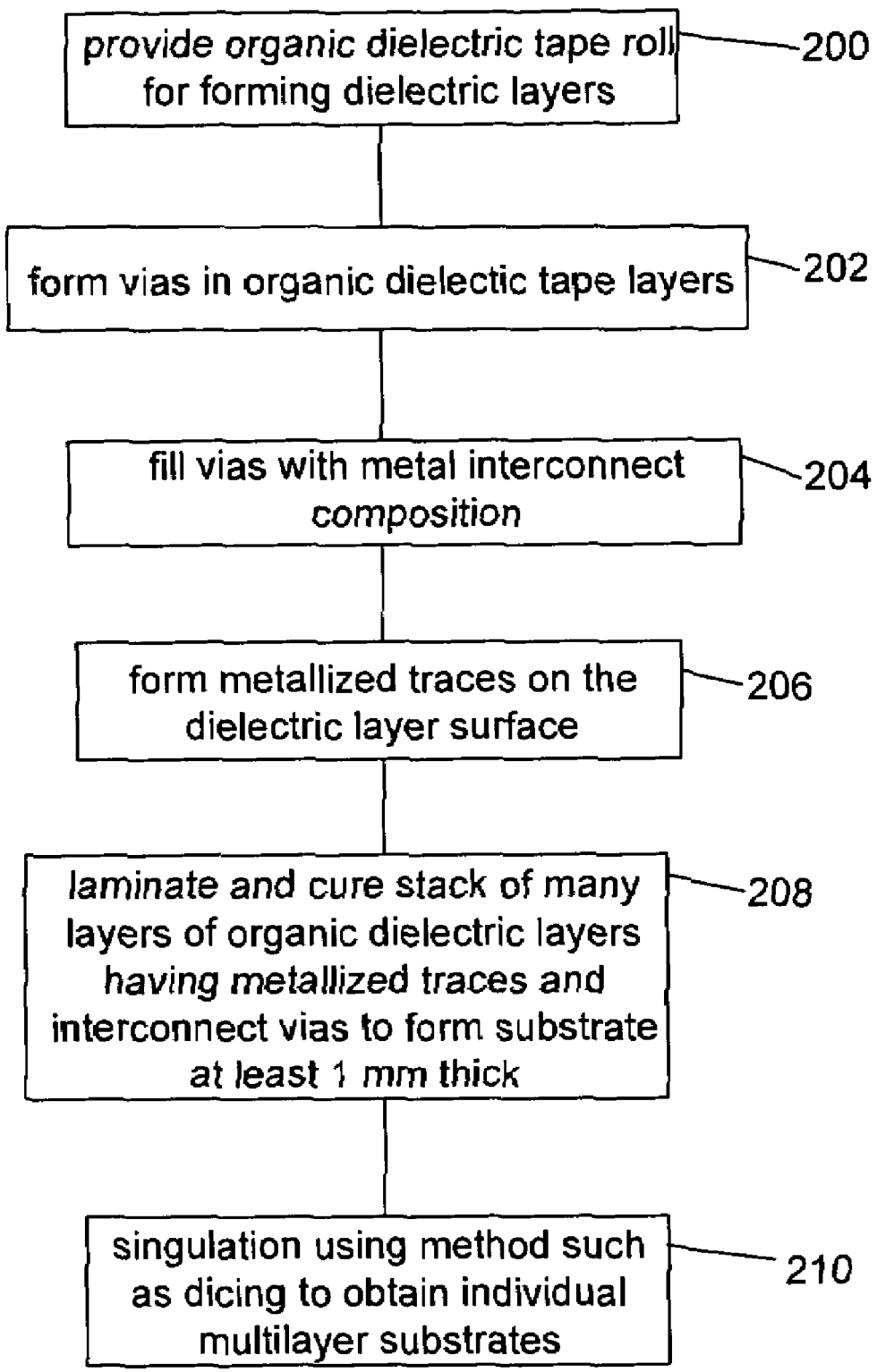
FIG. 3 illustrates a flow chart for a manufacturing method for forming a substrate such as that illustrated in FIG. 2, in accordance with certain embodiments.

A method for forming a package substrate, such as that illustrated in FIG. 2, is set forth in the flow chart of FIG. 3. Box 200 is providing an organic dielectric tape roll which is used for the dielectric layers 120-135 in the substrate 110. Box 202 is via formation in the organic dielectric tape. The via formation may be carried out using a suitable method such as punching. Box 204 is via filling with a metallized composition. Box 206 is forming the metallization traces on the surface of the organic dielectric. Metals which may be used include, but are not limited to Ni/Au, Cu and Au. The via filling and metallization may be carried out using a suitable deposition process including, but not limited to, printing or plating. Such a process will be used to form metallization traces that are typically about 10-20 μm thick. Box 208 is laminating and curing multiple layers to obtain a thick package that is at least 1 mm thick. The laminating and curing process will include the application of pressure to the stack through upper organic dielectric layer 120 and lower organic dielectric layer 135, and then the application of heat to cure the polymer organic dielectric layers 120-135 Box 210 is singulation to obtain the individual packages using, for example a dicing process. Various testing procedures may also be included at one or more points during the processing to ensure that the layers are properly formed.

An organic process flow such as that described above in connection with FIG. 4 may include a variety of advantages over a conventional ceramic process flow, including less steps. For example, a conventional ceramic process flow will include firing at an elevated temperature when compared with the organic process flow, because the co-firing temperatures for adequate ceramic layer sintering are substantially higher the curing temperatures used with organic polymers. A conventional ceramic process flow may also include milling & mixing and casting operations, which are not necessary in the organic process flow, where a preformed roll of the organic dielectric material may be used. Thus, a thick package may be formed more efficiently using an organic process flow in accordance with embodiments such as described above. For example, in one embodiment, a package substrate for mounting a 20-30 mm by 30-40 mm die using suitable flip chip die attach processes may have an area of 50-60 mm by 100-120 mm and be about 2.6 mm thick.

Examples of via fill and electrically conductive materials that may be used in certain embodiments, include, but are not limited to, Cu, Ag, and Cu/Sn alloys.

Figure 4:
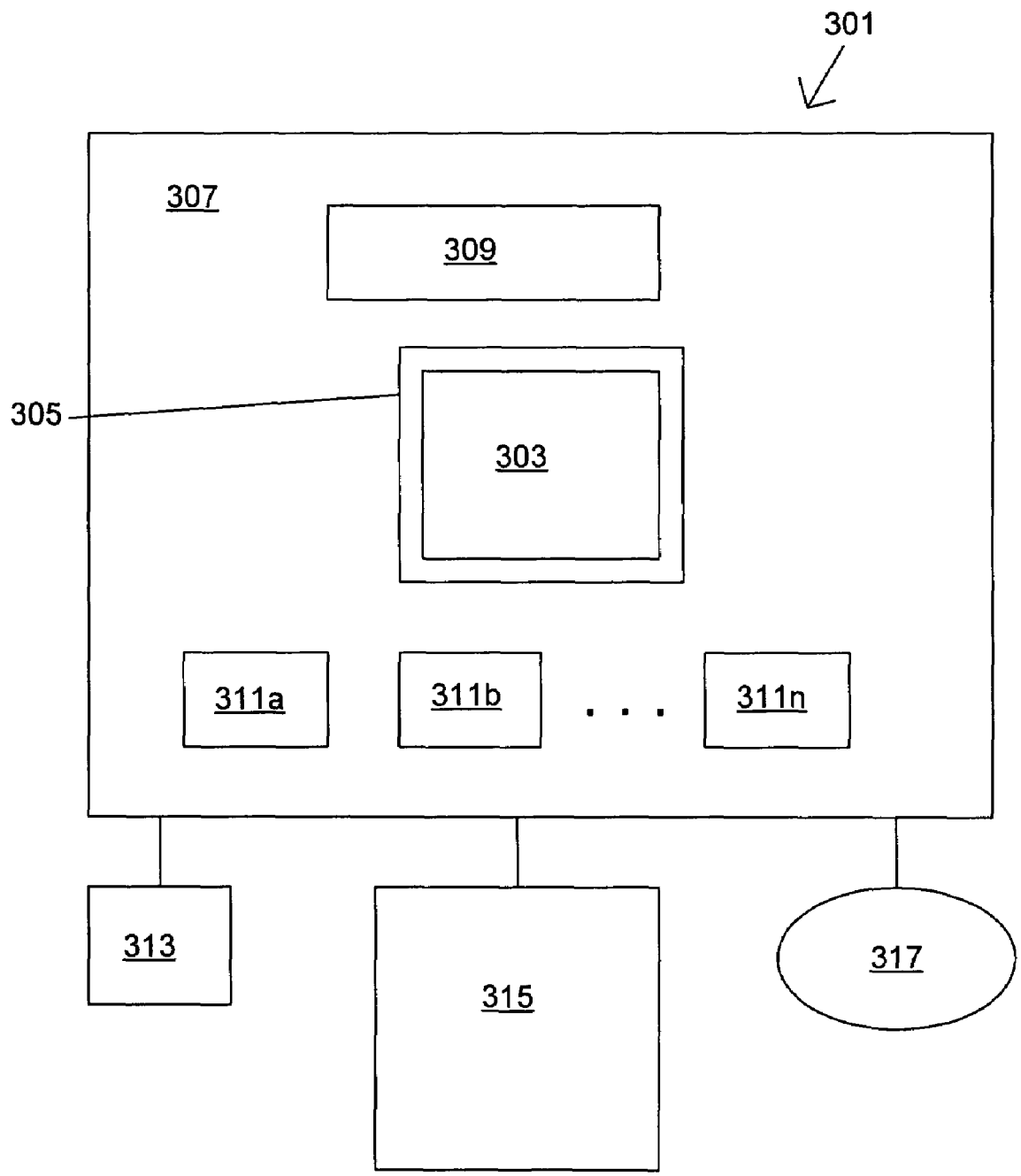
FIG. 4 illustrates one example of a computing environment in which aspects of certain embodiments may be embodied.

FIG. 4 illustrates one example of a computing environment in which aspects of described embodiments may be embodied. The computing environment includes a computer 301 including at least one central processing unit (CPU) 303. The CPU 303, also referred to as a microprocessor, may be attached to an integrated circuit package substrate 305, which is then coupled to a printed circuit board 307, which in this embodiment, is a motherboard. The integrated circuit package substrate 305 is an example of a substrate such as, a flip chip package, in accordance with the embodiments shown in FIGS. 1-2 and discussed above.

The computer 301 further may further include memory 309 and one or more controllers 311a, 311b . . . 311n, which are also disposed on the motherboard 307. The motherboard 307 may be a single layer or multi-layered board which has a plurality of conductive lines that provide communication between the circuits in the package 305 and other components mounted to the board 307. Alternatively, one or more of the CPU 303, memory 309 and controllers 311a, 311b . . . 311n may be disposed on other cards such as daughter cards or expansion cards. The CPU 303, memory 309 and controllers 311a, 311b . . . 311n may each be seated in individual sockets or may be connected directly to a printed circuit board. A display 315 may also be included.

Any suitable operating system and various applications execute on the CPU 303 and reside in the memory 309. The content residing in memory 309 may be cached in accordance with known caching techniques. Programs and data in memory 309 may be swapped into storage 313 as part of memory management operations. The computer 301 may comprise any suitable computing device, such as a mainframe, server, personal computer, workstation, laptop, handheld computer, telephony device, network appliance, virtualization device, storage controller, network controller, etc.

The controllers 311a, 311b . . . 311n may include a system controller, peripheral controller, memory controller, hub controller, I/O bus controller, video controller, network controller, storage controller, etc. For example, a storage controller can control the reading of data from and the writing of data to the storage 313 in accordance with a storage protocol layer. The storage protocol of the layer may be any of a number of known storage protocols. Data being written to or read from the storage 313 may be cached in accordance with known caching techniques. A network controller can include one or more protocol layers to send and receive network packets to and from remote devices over a network 317. The network 317 may comprise a Local Area Network (LAN), the Internet, a Wide Area Network (WAN), Storage Area Network (SAN), etc. Embodiments may be configured to transmit data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A method for forming multilayer substrate, comprising:
    forming a stack including a plurality of ceramic dielectric layers, the stack including upper and lower ceramic dielectric layers;
    providing a plurality of metallization traces on at least some of the ceramic dielectric layers in the stack;
    providing a plurality of vias in the ceramic dielectric layers, the vias formed to include electrically conductive material therein;
    forming a first metal layer on the upper ceramic dielectric layer;
    forming a second metal layer on the lower ceramic dielectric layer;
    wherein the first metal layer and the second metal layer are each formed to be at least 250 µm thick;
    wherein the stack including the plurality of ceramic dielectric layers and plurality of metallization traces are heated to densify the stack prior to the forming the first metal layer and prior to the forming the second metal layer;
    after the forming the first metal layer, forming a first additional ceramic dielectric layer on the first metal layer, the first metal layer positioned between the upper ceramic dielectric layer and the first additional ceramic dielectric layer; and
    after the forming the second metal layer, forming a second additional ceramic dielectric layer on the second metal layer, the second metal layer positioned between the lower ceramic dielectric layer and the second additional ceramic dielectric layer.

2. A method according to claim 1, further comprising forming the first metal layer and the second metal layer to each be no greater than 400 µm thick.

3. A method according to claim 1, further comprising forming the first metal layer and the second metal layer using an electroplating process.

4. A method according to claim 1, further comprising forming the first metal layer and the second metal layer using a direct bonding process.

5. A method according to claim 1, further comprising forming the first metal layer to be at least two times thicker than any of the plurality of ceramic dielectric layers positioned between the first metal layer and the second metal layer.

6. A method according to claim 1, further comprising forming the first metal layer and the second metal layer from a material comprising copper.

7. A method according to claim 1, further comprising forming the substrate to have a thickness in the range of 1 to 4 mm.

8. A method according to claim 1, further comprising forming the first metal layer to be thicker than any of the metallization traces.

9. A method according to claim 1, further comprising forming the first metal layer to be at least four times thicker than any of the plurality of ceramic dielectric layers positioned between the first metal layer and the second metal layer.

10. A method for forming a multilayer substrate, comprising:
    providing a plurality of ceramic dielectric layers, the ceramic dielectric layers including vias extending therethrough, the vias including a metal formed therein;
    forming metallization traces on at least some of the plurality of ceramic dielectric layers;
    stacking and heating the plurality of ceramic dielectric layers and the metallization traces to densify the stack, wherein the densified stack consists of the ceramic layers having the vias including the metal formed therein and the metallization traces;
    the stack including an upper ceramic layer and a lower ceramic layer;
    after the stacking and heating, forming a first metal layer on the upper ceramic layer and a second metal layer on the lower ceramic layer, wherein the metallization traces in the stack are formed to have a thickness of not greater than 20 µm, wherein the first metal layer is formed to have a thickness of not less than 250 µm, and wherein the upper ceramic layer and the lower ceramic layer are positioned between the first metal layer and the second metal layer;

forming a first additional ceramic dielectric layer on the first metal layer, wherein the first metal layer is positioned between the first additional ceramic dielectric layer and the upper ceramic dielectric layer, and forming a second additional ceramic dielectric layer on the second metal layer, wherein the second metal layer is positioned between the second additional ceramic dielectric layer and the lower dielectric layer.

11. A method according to claim 10, further comprising forming at least one electrically insulating region extending through the first metal layer, and at least one electrically insulating region extending through the second metal layer.

12. A method according to claim 10, further comprising forming the first metal layer and the second metal layer using an electroplating process.

13. A method according to claim 10, further comprising forming the substrate to have a thickness in the range of 1 to 4 mm.

14. A method according to claim 10, wherein the first and second metal layers are thicker than any of the metallization traces.

* * * * *